United States Patent
Versen et al.

(10) Patent No.: US 6,862,234 B2
(45) Date of Patent: Mar. 1, 2005

(54) METHOD AND TEST CIRCUIT FOR TESTING A DYNAMIC MEMORY CIRCUIT

(75) Inventors: Martin Versen, München (DE); Peter Beer, Fontainbleau (FR); Lee Nino, Raleigh, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/798,245

(22) Filed: Mar. 11, 2004

(65) Prior Publication Data

US 2004/0257893 A1 Dec. 23, 2004

(30) Foreign Application Priority Data

Mar. 11, 2003 (DE) .......................................... 103 10 570

(51) Int. Cl.[7] .............................................. G11C 29/00
(52) U.S. Cl. ..................... 365/201; 365/69; 365/189.04
(58) Field of Search ..................... 365/201, 69, 189.04, 365/185.14, 210, 207, 214

(56) References Cited

U.S. PATENT DOCUMENTS

| | | | | |
|---|---|---|---|---|
| 6,230,292 | B1 | * 5/2001 | Duesman et al. | ........... 714/718 |
| 6,310,812 | B1 | * 10/2001 | Pochmuller | ................. 365/210 |
| 2002/0089888 | A1 | 7/2002 | Kato | |
| 2002/0154560 | A1 | * 10/2002 | Stief et al. | ................... 365/201 |

OTHER PUBLICATIONS

German Examination Report dated Feb. 11, 2004.

* cited by examiner

*Primary Examiner*—Anh Phung
*Assistant Examiner*—Dang Nguyen
(74) *Attorney, Agent, or Firm*—Moser, Patterson & Sheridan, L.L.P.

(57) ABSTRACT

Method and system for testing a sense amplifier in a dynamic memory circuit. In one embodiment, the sense amplifier is connected to a first bit line pair via a first switching device and to a second bit line pair via a second switching device. First memory cells are arranged at crossover points between first word lines and one of the bit lines of the first bit line pair, and second memory cells are arranged at crossover points between second word lines and one of the bit lines of the second bit line pair. Data are written to the first and the second memory cells and subsequently read out. During the read-out of one of the first memory cells, the relevant first word line is activated and the first switching device is activated while the second switching device is closed, and during the read-out of one of the second memory cells, the relevant second word line is activated and the second switching device is activated while the first switching device being closed. One of the first and one of the second memory cells are read in a sequence such that the first and the second switching device are switched multiply during the test of the first and second memory cells.

20 Claims, 2 Drawing Sheets

METHOD AND TEST CIRCUIT FOR TESTING A DYNAMIC MEMORY CIRCUIT

CROSS-REFERENCE TO RELATED APPLICATIONS

This application claims foreign priority benefits under 35 U.S.C. §119 to co-pending German patent application number 103 10 570.0, filed Mar. 11, 2003. This related patent application is herein incorporated by reference in its entirety.

BACKGROUND OF THE INVENTION

1. Field of the Invention

The invention relates to a method for testing a dynamic memory circuit, and to a test circuit for carrying out the method.

2. Description of the Related Art

After the fabrication of integrated dynamic memory circuits, the memory circuits have to be tested for their specification-conforming functioning, in order to identify defects. Identified defects can then generally be repaired by replacing the memory areas in which a defect has occurred by memory areas provided in redundant fashion.

A defect is identified by firstly writing test data to the memory circuit and subsequently reading out the test data. By comparing the test data written in and the data read out, a defect is identified if the test data and the data read out differ.

Data are read from an integrated memory circuit with the aid of sense amplifiers. Depending on the position in the memory circuit, the sense amplifiers are connected to one or two bit line pairs. Each of the bit line pairs may be connected to the sense amplifier via a separate switching device. Furthermore, word lines are provided. Memory cells are situated at the crossover points between the word lines and a respective one of the bit lines of the respective bit line pair. The memory cells have a memory transistor and a storage capacitance, which is applied to the corresponding bit line under the control of the corresponding word line connected to the control input of the memory transistor. The charge difference thereby effected on the bit lines of the corresponding bit line pair is conducted via the corresponding switching device to the sense amplifier and amplified there.

The components of the integrated memory circuit are subject to fluctuations in a process-dictated manner, so that the parameters thereof change. Thus, by way of example, the capacitance of the storage capacitance may fluctuate from memory cell to memory cell and thus effect different charge differences on the bit lines of the bit line pair. For proper functioning, even small charge differences effected by memory cells with a small storage capacitance have to be amplified correctly by the sense amplifier.

It is also possible that the sense amplifier and the switching device by which the sense amplifier and the bit line pairs can be connected to one another are subject to process-dictated fluctuations. By way of example, they may switch the switching devices more slowly or more rapidly than prescribed by the specification, or the two bit lines of the relevant bit line pair are connected to or isolated from the sense amplifier in a different way, i.e., at different speeds. Moreover, by virtue of process-dictated weak or incorrectly dimensioned transistors, the sense amplifier may be too slow to carry out a sufficiently rapid and sufficiently large amplification of the charge difference on the bit lines in all cases.

SUMMARY OF THE INVENTION

Therefore, the object of the present invention is to provide a test method by means of which, in particular, the functioning of the sense amplifier and the switching device connected thereto for the bit lines can be checked in an improved manner. Furthermore, it is an object of the present invention to provide a test circuit for testing a memory circuit by means of which the sense amplifiers and the switching devices via which the bit lines are connected to the sense amplifiers can be checked in an improved manner.

A first aspect of the present invention provides a method for testing a dynamic memory circuit. The memory circuit has a sense amplifier which is connected to a first bit line pair via a first switching device and to a second bit line pair via a second switching device. First memory cells are arranged at crossover points between first word lines and one of the bit lines of the first bit line pair, and second memory cells are arranged at crossover points between second word lines and one of the bit lines of the second bit line pair. For the testing of the memory circuit, data are written to the first and second memory cells and subsequently read out again. During the read-out of one of the first memory cells, the relevant first word line is activated, the first switching device being activated and the second switching device being closed. During the read-out of one of the second memory cells, correspondingly, the relevant second word line is activated, the first switching device being closed and the second switching device being activated. According to the invention, the first and the second memory cells are read in a sequence, so that the first and the second switching device are essentially switched multiply during the test of the first and second memory cells.

In the case of the previous testing of dynamic memory circuits, no or only inadequate test operations are carried out for testing the proper functioning of the sense amplifiers arranged within the memory circuit and of the switching devices connected thereto. Essentially, during the read-out of the memory cells for testing the functioning of the memory cells, the word lines are activated successively and the corresponding data are read from the memory cells situated thereon. This is quite generally effected such that firstly the memory cells on the first bit line pair of a sense amplifier are read successively and then the memory cells on the second bit line pair of the sense amplifier are read successively. In this way, the first and the second switching device are switched over only during the change from reading the first memory cells to reading the second memory cells.

Two possible defects cannot be identified thereby. The switching devices are usually formed by transistors which are switched on or off in accordance with a control signal. The switching device is switched on or off in a predefined temporal position with respect to a charge equalization which equalizes the charges on the bit lines of a bit line pair. The charge equalization is usually carried out by a transistor which is arranged between the two bit lines of a bit line pair and equalizes the charges on the two bit lines through an activation of this equalization transistor.

A further aim of the equalization transistor is to return the sense amplifiers to an operating point at which it is possible, in an optimum manner, to detect a small positive as well as negative charge difference on the connected bit lines. If the switching device switches too early, however, which may be brought about by defectively processed transistors or transistors having non-specification-conforming parameters, then the corresponding sense amplifier is not returned to the operating point by the equalization transistor. The sense amplifier is thus in an undefined state which, under certain circumstances, does not enable said sense amplifier to detect a positive and/or negative charge difference on the connected bit lines during a next read-out operation. Particularly if the parameters of the transistors of the switching device differ only a little from the desired, specification-conforming parameters, the sense amplifier is brought from the operating point only to a small extent. Thus, "strong" memory cells, i.e., memory cells having a high storage capacitance, can compensate for the shifted operating point of the sense amplifier and nevertheless lead to a correct read-out of the stored datum. "Weak" memory cells, however, i.e., those having a low storage capacitance, cannot store enough charge to bring about a sufficiently large charge difference on the bit lines of the corresponding bit line pair, so that the small charge difference cannot be detected by the sense amplifier at a non-optimum operating point.

If it is then the case in the event of a change from reading the first memory cells to reading second memory cells, the first of the second memory cells which is read is a strong memory cell, under certain circumstances a defective first switching device is not identified, and vice versa.

A further possibility where a defective switching device is not identified occurs in the back-end test operation. During the back-end test operation, defective memory areas that have already been identified are replaced by redundant memory areas. Therefore, at a sense amplifier to which a first and a second bit line pair are connected, one of the connected bit line pairs may be replaced by a redundant bit line pair at a different location of the memory circuit. On account of the addressing signals of the integrated circuit which have not been switched off, the first and the second switching device also remain active for replaced memory areas and are controlled by a corresponding memory circuit. Particularly in the event of a defect in which one of the bit lines of the bit line pair which has been replaced by a redundant bit line pair is pulled to a fixed potential, e.g., a ground potential or a high supply voltage potential, there arises during the charge equalization by the equalization transistor a voltage value in the replaced bit line pair which is shifted compared with the customary center voltage but which is applied to the sense amplifier on account of switching devices which have not been completely switched off. Depending on a parameter of the transistors with which the sense amplifier is realized, the sense amplifier may, as a result, assume a state that differs from an optimum amplification condition. This non-optimum state may result in a weak memory cell not leading to a sufficiently large charge difference in the bit lines of the non-repaired bit line pair, so that it may be amplified by the sense amplifier, not set optimally to the operating point. Such a defect cannot be ascertained according to the previous test methods if, after a change from reading the first memory cells to reading the second memory cells, the first of the second memory cells is a strong memory cell.

Therefore, one embodiment of the invention provides for the switching devices to be tested in an improved manner by being switched multiply by changes from reading first memory cells and reading second memory cells. Consequently, each of the switching devices is tested with different memory cells, so that a defect can be detected more reliably.

In one embodiment, the first and the second memory cells are read alternately, so that each of the first and second memory cells can be tested with a switching of the respective switching device. Since the memory circuit is thus indeed tested in an intensified test condition, but also under conditions which can occur in reality, there is no need for a separate test pass for testing the switching device, rather the testing of the switching device can essentially be combined with each test operation during which all the memory cells are read at a sense amplifier.

The first and second memory cells may be addressed by means of addresses, and the first and the second switching device may be driven by means of the least significant address bit of the address. In this way, by incrementing the test address, it is possible to achieve a change in the read-out from the first bit line pair to the second bit line pair in a simple manner.

A further aspect of the present invention provides a test circuit for testing a memory circuit. A sense amplifier is connected to a first bit line pair via a first switching device and to a second bit line pair via a second switching device. First memory cells are arranged at the crossover points between first word lines and one of the bit lines of the first bit line pair, and second memory cells are arranged at crossover points between second word lines and one of the bit lines of the second bit line pair. The test circuit is configured to write test data to the first and the second memory cells and subsequently to read the latter. The test circuit, during the read-out of one of the first memory cells, activates the relevant first word line and activates the first switching device and closes the second switching device. The test circuit, during the read-out of one of the second memory cells, activates the relevant second word line, closes the first switching device and activates the second switching device. The test circuit controls the read-out of the first and the second memory cells in such a way that the first and the second memory cells are read in a sequence in such a way that the first and the second switching device are essentially switched multiply during the testing of the first and second memory cells.

The test circuit has the advantage that, for the read-out of the data from the memory cells at a sense amplifier, during testing, essentially the first and the second switching devices and the sense amplifier are concomitantly tested. The bit lines of the first bit line pair may be connected to a first equalization device, and the bit lines of the second bit line pair may be connected to a second equalization device.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
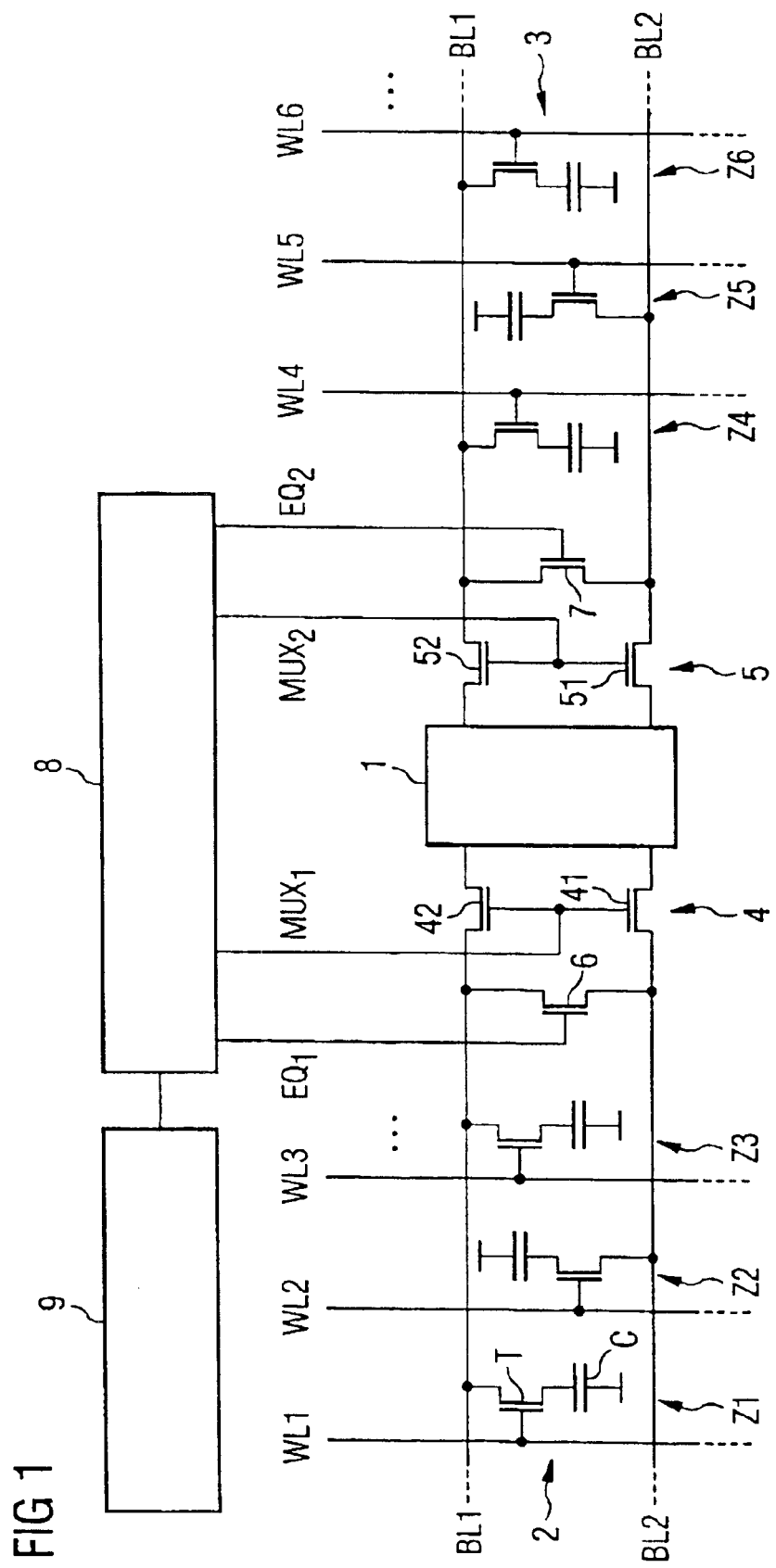
FIG. 1 shows a detail from a dynamic memory circuit with a test circuit according to one embodiment of the invention.

FIG. 1 illustrates a detail from a dynamic memory circuit. The memory circuit comprises a sense amplifier 1, to the left-hand side of which a first bit line pair 2 is connected via a first switching device 4 and to the right-hand side of which a second bit line pair 3 is connected via a second switching device 5.

The first bit line pair 2 has a first bit line BL1 and a second bit line BL2. The bit lines BL1, BL2 of the first bit line pair 2 are crossed by first word lines WL1, WL2 and WL3. A first memory cell Z1 is situated at the crossover point between the first bit line BL1 of the first bit line pair 2 and one of the first word lines WL1. The first memory cell Z1 has a memory transistor T and a storage capacitance C. The memory transistor T and the storage capacitance C are switched in such a way that the memory transistor is activated by means of an activation signal on the first word line WL1, so that the charge in the storage capacitance C flows onto the first bit line BL1.

A further memory cell Z2 is situated at the crossover point between the second bit line BL2 of the first bit line pair 2 and a further one of the first word lines WL2, and another memory cell Z3 is situated at the crossover point between the first bit line BL1 and a third one of the word lines WL3. The first memory cells Z1, Z2, Z3 are essentially of physically identical form. In essence, the arrangement of the first memory cells Z1, Z2, Z3 is such that only one memory cell per bit line pair can be driven on each of the first word lines WL1, WL2, WL3.

Normally, there is a large number of first word lines, e.g., 1024 word lines, which cross the bit lines of the first bit line pair 2. In the same way, second word lines WL4, WL5, WL6 cross the first bit line BL1 of the second bit line pair 3 and the second bit line BL2 of the second bit line pair 3. In the same way as on the first bit line pair 2, second memory cells Z4, Z5, Z6 are arranged in physically identical form on the second bit line pair 3. The second bit line pair 3 is also crossed by a large number of word lines, for example, 1024 word lines.

The first switching device 4 has a first switching transistor 41 and a second switching transistor 42. The control inputs of the first and second switching transistors 41, 42 are connected to a first switching signal MUX1. The second switching device 5 has a third switching transistor 51 and a fourth switching transistor 52, whose control inputs are driven by a second switching signal MUX2.

In addition, a first equalization transistor 6 is activated in accordance with a first equalization signal EQ 1, so that the potentials on the first bit line BL1 and on the second bit line BL2 of the first bit line pair 2 are equalized. In the same way, the charges on the first bit line BL1 and on the second bit line BL2 of the second bit line pair 3 can be connected to one another using a second equalization transistor 7 in a similar arrangement in accordance with a second equalization signal EQ2 in order to equalize the charge potentials on the bit lines BL1, BL2 of the second bit line pair. The first and second equalization signals EQ1, EQ2 and the first and second switching signals MUX1, MUX2 are provided by a control device 8.

To read out a datum from one of the first memory cells Z1, Z2, Z3, e.g., the first memory cell Z1, the potentials on the first bit line BL1 and on the second bit line BL2 of the first bit line pair 2 are first equalized. This is done by the first equalization transistor 6 being activated in accordance with the first equalization signal EQ1. Through deactivation of the first equalization signal EQ1, the first equalization transistor 6 is turned off and the word line WL1 is subsequently activated, so that the relevant memory transistor T is activated. The charge stored in the corresponding storage capacitance C flows onto the first bit line BL1, where it changes the potential generally by a few milli volts, e.g., 10 mV.

Afterward or concurrently, the switching device 4 is activated, so that the potentials of the first bit line BL1 and of the second bit line BL2 are applied to the sense amplifier 1. The sense amplifier 1 detects the sign of the potential difference on the two bit lines BL1, BL2 of the bit line pair 2 and amplifies the potential difference on the bit lines BL1, BL2, the sign being retained. Depending on whether the bit line potential of the first bit line BL1 is greater or less than the potential of the second bit line BL2, a first data value or a second data value is output at a corresponding data output (not shown) of the sense amplifier 1.

After the read-out has been effected, the corresponding word line WL1 is deactivated and the first equalization transistor 6 is activated in accordance with the first equalization signal EQ1 in order to equalize the charge differences on the first bit line BL1 and the second bit line BL2. During a subsequent renewed addressing of one of the first memory cells Z1, Z2, Z3 after the read-out of one of the first memory cells, the first switching device 4 is not switched off, but rather remains switched on.

During the read-out of one of the first memory cells, the second switching device 5 remains switched off, so that the first and second bit lines BL1, BL2 of the second bit line pair 3 are not connected to the sense amplifier 1. During the addressing of one of the second memory cells Z4, Z5, Z6, correspondingly, the first switching device 4 is turned off and the second switching device 5 is activated, so that the first bit line BL1 and the second bit line BL2 of the second bit line pair 3 are connected to the sense amplifier 1.

During the testing of the memory cells of the dynamic memory circuit, test data are written to all the memory cells and the stored data are subsequently read out again in order to ascertain a defect of the memory cell through a deviation between test data written in and data read out. Usually, the writing in and reading out of data are repeated multiply with different test data and under different external conditions, in order also to be able to rule out so-called "soft" defects, i.e., defects which occur only under specific conditions. Test data written in previously have been read out hitherto by successive activation of the corresponding word lines in the order of their physical arrangement in the dynamic memory module, i.e., firstly all the first memory cells are read successively and afterward all the second memory cells. The testing of the memory circuit is controlled by a test circuit 9.

After each read-out of a memory cell, if the datum read out has been sent to the sense amplifier 1 on a data line (not shown), the different charge potentials of the first bit line BL1 and of the second bit line BL2 are equalized. This is done by means of the equalization transistors 6, 7, which are activated by the equalization signals EQ1, EQ2. At the same time, through the short-circuiting of the first and second bit lines BL1, BL2 and by means of the respectively activated switching device 4, 5, the sense amplifier 1 is returned to the operating point at which the sense amplifier 1 has the greatest possible sensitivity toward positive as well as negative potential differences on the bit lines. During the successive read-out, for example of the first memory cell, the word line is activated and the charge difference is amplified by means of the sense amplifier 1 and read out. After the read-out, the activated equalization transistor 6 equalizes the charge potentials on the two bit lines BL1, BL2 before the next word line is activated. The first switching device 4 remains activated during the read-out of the first memory cells. The first switching device 4 is switched off only when the second memory cells, rather than the first memory cells, are then intended to be accessed. The second switching device 5 is then activated at about the same time as the switching-off of the first switching device 4.

The switch-over between the first and the second switching device 4, 5 in the event of a change may be effected after a predefined time after the activation of the respective equalization device 6, 7.

Process fluctuations may give rise to parametric shifts in the first and/or second switching transistor 41, 42 and, respectively, the third and/or fourth switching transistor 51, 52. These may have the effect, for example, that the voltage range of the control voltage in the case of which the switching transistors 41, 42, 51, 52 undergo transition from an on to an off state, and vice versa, is too high, so that, in the event of a voltage change in accordance with the control signal MUX1, e.g., the first and second switching transistors 41, 42 are switched off too early. The consequence of the switching device 4 being switched off too early in this way is that the sense amplifier 1 may possibly have not yet returned to the operating point completely by the charge equalization from the equalization transistor 6. Since at the same time as the switching-off of the first switching device 4, the second switching device 5 is switched on in order to read second memory cells, the sense amplifier 1 is not at its operating point during the read-out of the first of the second memory cells. The consequence of this is that, under certain circumstances, the stored information cannot be read out correctly by the sense amplifier 1. In particular, it is possible that the read-out of a strong memory cell, i.e., a memory cell with high charge information, can still be formed correctly, while the charge information of a weak memory cell, i.e., a memory cell having a lower storage capacitance, is effected in defective fashion. This defect then cannot be identified by the previously known test method and may occur until in the later application.

During the read-out of the first and second memory cells, as described above, firstly the first memory cells and then the second memory cells are read, only a change from reading first memory cells at the first bit line pair 2 to second memory cells at the second bit line pair 3 being effected. If a strong memory cell is read as first memory cell of the second bit line pair, then a defect of the first switching device 4 may possibly not be identified. A defect of the second switching device cannot be identified in any case since the switching device is switched only once from the off to the activated state. Thus, a defective first switching device 4 can only be identified when a weak second memory cell, which normally, i.e., in the case of switching devices 4, 5 functioning in a specification-conforming manner, would lead to a correct read-out result, is read as first of the second memory cells after a switching of the switching devices 4, 5. This case is rare, and a defect would accordingly be identified only rarely.

In order to be able to check the functionality of the switching devices, 4, 5 more reliably, therefore, one embodiment of the invention proposes reading the first and second memory cells in a sequence in which the switching devices 4, 5 are switched multiply from an off to an on state and back. The optimum testing of the switching devices 4, 5 results if, after each read-out of a first memory cell, the first switching device 4 is switched off and the second switching device 5 is turned on and then one of the second memory cells is read. After the read-out of the second memory cell the second switching device 5 is then turned off again and the first switching device 4 is turned on in order subsequently to read the next of the first memory cells. This is continued until all of the first and second memory cells have been read.

If a defective switching device 4, 5 is identified by the test method described above, then it is possible to exchange the bit line pair connected to the defective switching device for a redundant memory area.

A further defect mechanism may occur in the back-end test operation. If one of the bit line pairs 2, 3 is replaced by a redundant bit line pair, the memory cells of the replaced bit line pair are indeed addressed, but the read-out information present at a data output of the sense amplifier is not evaluated. In the event of the addressing of the corresponding address of the defective bit line pair, accordingly, the corresponding switching device 4, 5 is also activated and the signal read out is evaluated in accordance with the normal function in the sense amplifier 1. If one of the bit lines of the replaced bit line pair is permanently connected to a word line or a supply voltage line, then it is not possible to correctly read the memory cells there and the word line voltage or the supply voltage will always determine the signal on the bit line pair.

During the charge equalization, by way of example, the first bit line of the repaired bit line pair may be poled to a ground potential on account of a permanent short circuit and thus bring about an asymmetrical voltage situation on the bit lines of the relevant bit line pair. By virtue of the opened switching device at the repaired bit line pair, there is asymmetry of the voltages in the sense amplifier as well, which, even after the relevant switching device has been switched off, remains in a state in which the voltage at the terminal which can be connected to the first bit line and the voltage on the terminal which can be connected to the second bit line are different. In the example illustrated, in which the first bit line of the first bit line pair is poled to a ground potential, it would not be possible subsequently to read out a positive charge difference between the first bit line BL1 and the second bit line BL2 of the second bit line pair. However, even in the case of non-equalized voltages on the bit lines of a bit line pair, a properly functioning sense amplifier must assume an operating point at which the memory cells of the respective other bit line pair can subsequently be read.

By means of a back-end test operation, the test method according to the invention can thus test whether the sense amplifier is able to read each of the memory cells of the non-repaired bit line pair once the incompletely equalized voltages of the bit lines of the replaced bit line pair have been applied to the sense amplifier. Such testing does not constitute an intensified test condition. In normal operation, too, such accesses are possible since, even in the case of replaced bit line pairs, the switching devices remain active and the relevant sense amplifier can thus also be connected to a defective bit line pair.

Figure 2:
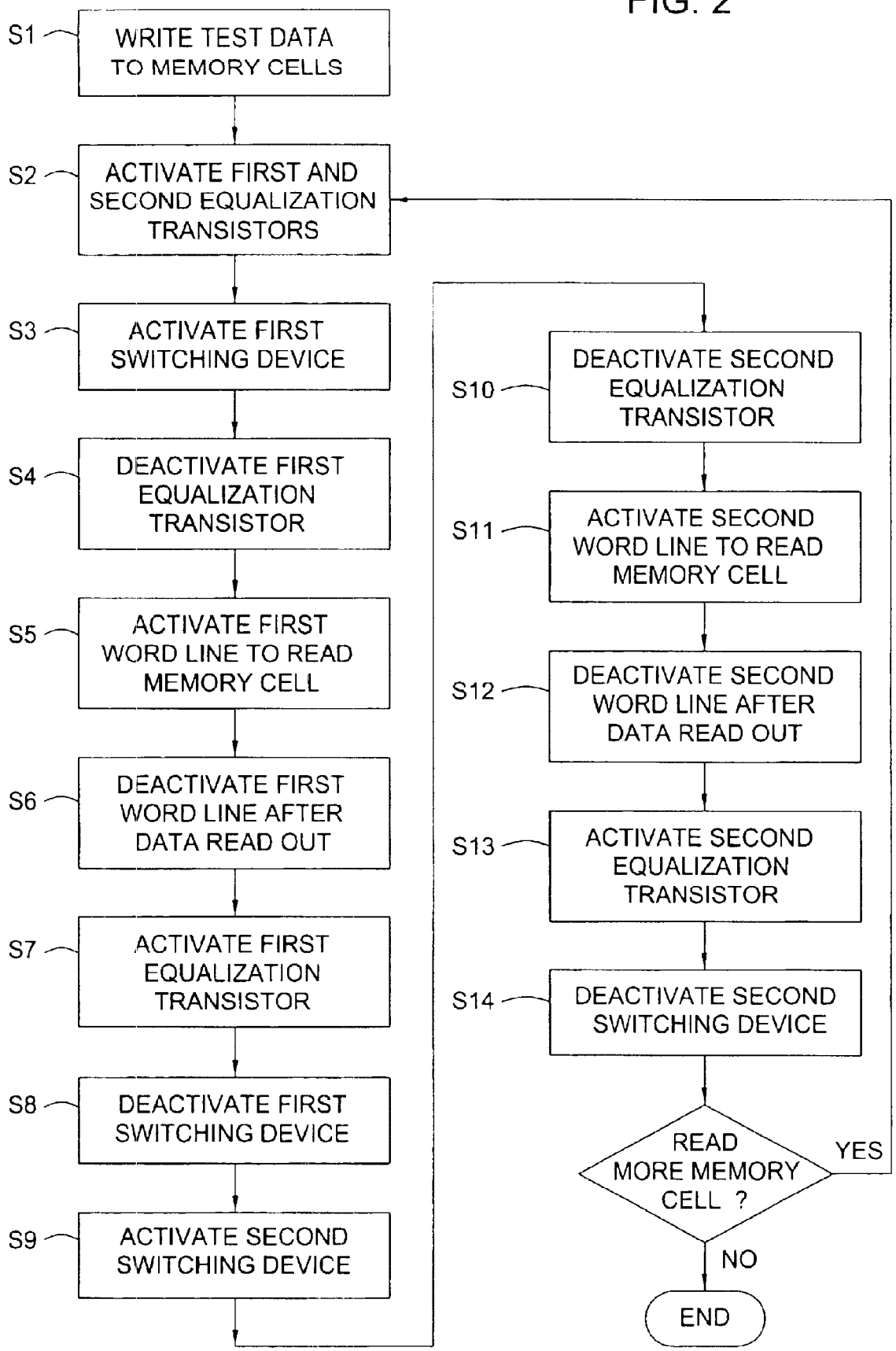
FIG. 2 shows a flow diagram for illustrating the method according to one embodiment of the invention.

FIG. 2 illustrates the method according to one embodiment of the invention using a flow diagram. In step S1, at the beginning of the test operation, firstly test data are written to all the memory cells. In a step S2, in the case of deactivated word lines, firstly the equalization transistors 6, 7 are activated in order to equalize the charges on the first bit line and the second bit line BL1, BL2 of the bit line pairs. Afterward, in a step S3, the first switching device 4 is opened (if it is not already open) and the sense amplifier 1 is thus brought to an operating point by means of the equalization transistor 6, which is still activated.

In a subsequent step S4, the equalization transistor 6 is switched off and, in a step S5, the first word line WL1 is activated for the read-out of one of the first memory cells Z1, Z2, Z3. The word line WL1 remains activated for a specific time, so that the charge from the storage capacitance C can flow onto the respective bit line of the first bit line pair 2. The charge difference between the first bit line BL1 and the second bit line BL2 is detected by the sense amplifier 1 and amplified on the bit lines.

In a step S6, the word line WL1 is deactivated as soon as the amplification of the read-out charge information by the sense amplifier is concluded. As soon as the word line is deactivated, in a step S7, the equalization transistor 6 is activated again in order to equalize the charge potentials on the first and second bit lines BL1, BL2 of the first bit line pair 2. At the same time, the sense amplifier 1 is intended to be returned to the operating point.

Since, in normal operation, the sense amplifier 1 must be available as rapidly as possible for a read-out of a second memory cell, a predetermined time is prescribed in which the sense amplifier must have reached the operating point. In other words, if a second memory cell is intended to be accessed next, the first switching device 4, in a step S8 is switched off a specific time after the activation of the equalization transistor 6 after the readout of a first memory cell so that the bit lines of the first bit line pair are isolated from the sense amplifier 1. If this isolation takes place too rapidly, then the sense amplifier does not have sufficient time available to assume the operating point. Afterward or at about the same time as the closing of the first switching device, the second switching device 5 is opened in a step S9, and afterward or at about the same time, the second equalization transistor 7 is deactivated (step S10) with the aid of the equalization signal EQ2.

The relevant second word line is subsequently activated at the second memory cell to be read in a step S11. The second word line remains activated until the charge difference on the bit line BL1, BL2 of the second bit line pair 3 has been read out by the sense amplifier 1. Afterward, in step S12, the corresponding word line is deactivated and, with the aid of the second equalization signal EQ2, the equalization transistor 7 is turned on again (step S13) in order to equalize the charge potentials of the bit lines BL1, BL2 of the second bit line pair 3. This means, however, that the sense amplifier 1 is returned to its operating point on account of the activated second switching device 5. Furthermore, in a step S14, the second switching device 5 is closed and the first switching device 4 is opened.

If further memory cells are to be read as determined in step S15, a return is made to step S3, and the read-out of further first memory cells and further second memory cells is continued. The read-out is ended if no further memory cells have to be read.

If a different number of first and second memory cells are situated at the first bit line pair 2 or at the second bit line pair 3, then it may be possible for one of the first or one of the second memory cells to be read multiply in order to test the switching devices 4, 5 and, respectively, the sense amplifier 1 with all of the first and all of the second memory cells.

While the foregoing is directed to embodiments of the present invention, other and further embodiments of the invention may be devised without departing from the basic scope thereof, and the scope thereof is determined by the claims that follow.

What is claimed is:

1. A method for testing a sense amplifier in a dynamic memory circuit having at the sense amplifier connected to a first bit line pair via a first switching device and to a second bit line pair via a second switching device and first memory cells arranged at crossover points between first word lines and one of the bit lines of the first bit line pair and second memory cells being arranged at crossover points between second word lines and one of the bit lines of the second bit line pair, comprising:

writing data to the first and the second memory cells to be subsequently read out;

during readout of one of the first memory cells, activating a relevant first word line and the first switching device while the second switching device is closed; and during read-out of one of the second memory cells, activating a relevant second word line and the second switching device while the first switching device is closed;

wherein one of the first and one of the second memory cells are read in a sequence such that the first and the second switching devices are switched multiply during testing of the first and second memory cells.

2. The method of claim 1, wherein the first and the second memory cells are read alternately.

3. The method of claim 2, wherein the first and second memory cells are addressed by a plurality of addresses and the first and second switching devices are driven by a least significant address bit of respective addresses.

4. The method of claim 1, wherein charge potentials of the bit lines of the first bit line pair are equalized before activation of one of the first word lines, and wherein charge potentials of the bit lines of the second bit line pair are equalized before activation of one of the second word lines.

5. A testing system, comprising:

a test circuit for testing a sense amplifier of a memory circuit;

a first switching device connected to a first bit line pair and the sense amplifier and a second switching device connected to a second bit line pair and the sense amplifier; and first memory cells arranged at crossover points between first word lines and one of the bit lines of the first bit line pair and second memory cells being arranged at crossover points between second word lines and one of the bit lines of the second bit line pair;

wherein the test circuit is configured to write test data to the first and the second memory cells and subsequently to read out said test data;

the test circuit, during the read-out of one of the first memory cells, activating the relevant first word line, activating the first switching device and closing the second switching device;

the test circuit, during the read-out of one of the second memory cells, activating the relevant second word line, closing the first switching device and activating the second switching device; and wherein the test circuit controls the read-out of the first and the second memory cells such that the first and the second switching device are switched multiply during testing of the first and second memory cells.

6. The testing system of claim 5, wherein the test circuit controls the read-out such that the first and the second memory cells are read alternately.

7. The test system of claim 5, further comprising:

a first equalization device connected to the first switching device and the first bit line pair; and a second equalization device connected to the second switching device and the second bit line pair.

8. The test system of claim 7, wherein the first equalization and second equalization devices are configured to equalize charges on the first and second bit line pairs respectively, before and after read-out of the first and second memory cells respectively.

9. The test circuit of claim 8, further comprising a control device connected to the first and second switching devices and the first and second equalization devices.

10. The test system of claim 9, wherein the control device provides signals to selectively activate and deactivate the first and second switching devices and the first and second equalization devices.

11. A method for testing a memory circuit, comprising:
writing data to first memory cells and second memory cells, the first memory cells arranged at crossover points between first word lines and one of first bit lines, the second memory cells arranged at crossover points between second word lines and one of second bit lines;
reading data from one of the first memory cells by activating a first word line and a first switching device connected to a sense amplifier and the first bit lines;
reading data from one of the second memory cells by activating a second word line and a second switching device connected to the sense amplifier and the second bit lines; and
repeating the reading steps for remaining first and second memory cells.

12. The method of claim 11, wherein the second switching device is deactivated while data is being read from the first memory cells and the first switching device is deactivated while data is being read from the second memory cells.

13. The method of claim 11, further comprising:
prior to reading data from each of the first memory cells, activating a first equalization device connected to the first bit lines to equalize charge potentials of the first bit lines; and
prior to reading data from each of the second memory cells, activating a second equalization device connected to the second bit lines to equalize charge potentials of the second bit lines.

14. The method of claim 13, wherein a control device sends signals to selectively activate and deactivate the first and second switching devices.

15. The method of claim 14, wherein the control device sends signals to selectively activate and deactivate the first and second equalization devices.

16. The method of claim 15, wherein a test circuit controls the testing of the memory circuit and the operation of the control device.

17. The method of claim 11, wherein the first and second memory cells are addressed by a plurality of addresses and the first and second switching devices are driven by a least significant address bit of the addresses.

18. The method of claim 16, wherein the first bit lines and the second bit lines are redundant bit lines.

19. The methods of claim 11, wherein each of the first memory cells are read sequentially.

20. The methods of claim 11, wherein individual first memory cells are read alternately with individual second memory cells.

* * * * *